United States Patent
Miller

(10) Patent No.: US 6,798,225 B2
(45) Date of Patent: Sep. 28, 2004

(54) TESTER CHANNEL TO MULTIPLE IC TERMINALS

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/142,550

(22) Filed: May 8, 2002

(65) Prior Publication Data

US 2003/0210031 A1 Nov. 13, 2003

(51) Int. Cl.[7] .................... G01R 31/02; G01R 31/26
(52) U.S. Cl. ........................... 324/754; 324/765
(58) Field of Search .................... 324/754, 757–758, 324/760, 762, 765, 158.1; 714/724, 734, 738, 742; 333/33, 246–247; 702/85–89, 104–119

(56) References Cited

U.S. PATENT DOCUMENTS

| | | | | |
|---|---|---|---|---|
| 4,616,178 A | * | 10/1986 | Thornton et al. | 324/754 |
| 5,546,405 A | * | 8/1996 | Golla | 324/754 |
| 5,974,662 A | * | 11/1999 | Eldridge et al. | 29/842 |
| 6,064,213 A | * | 5/2000 | Khandros et al. | 324/754 |
| 6,154,715 A | * | 11/2000 | Dinteman et al. | 714/738 |
| 6,175,939 B1 | * | 1/2001 | Dinteman | 714/724 |
| 6,218,910 B1 | * | 4/2001 | Miller | 324/765 |
| 6,255,126 B1 | * | 7/2001 | Mathieu et al. | 438/15 |
| 6,333,269 B2 | * | 12/2001 | Naito et al. | 438/706 |
| 6,377,062 B1 | * | 4/2002 | Ramos et al. | 324/754 |
| 6,501,343 B2 | * | 12/2002 | Miller | 324/765 |
| 6,603,323 B1 | * | 8/2003 | Miller et al. | 324/754 |
| 6,606,575 B2 | * | 8/2003 | Miller | 702/104 |
| 6,622,103 B1 | * | 9/2003 | Miller | 702/89 |
| 6,686,754 B2 | * | 2/2004 | Miller | 324/754 |
| 2001/0012739 A1 | * | 8/2001 | Grube et al. | 439/78 |
| 2002/0049554 A1 | * | 4/2002 | Miller | 702/104 |
| 2002/0132501 A1 | * | 9/2002 | Eldridge et al. | 439/66 |
| 2003/0237061 A1 | * | 12/2003 | Miller et al. | 257/47 |
| 2004/0008024 A1 | * | 1/2004 | Miller | 324/158.1 |

* cited by examiner

Primary Examiner—Kamand Cuneo
Assistant Examiner—Jermele Hollington
(74) Attorney, Agent, or Firm—Smith-Hill and Bedell

(57) ABSTRACT

A probe card provides signal paths between integrated circuit (IC) tester channels and probes accessing input and output pads of ICs to be tested. When a single tester channel is to access multiple (N) IC pads, the probe card provides a branching path linking the channel to each of the N IC input pads. Each branch of the test signal distribution path includes a resistor for isolating the IC input pad accessed via that branch from all other branches of the path so that a fault on that IC pad does not substantially affect the voltage of signals appearing on any other IC pad. When a single tester channel is to monitor output signals produced at N IC pads, the resistance in each branch of the signal path linking the pads of the tester channel is uniquely sized to that the voltage of the input signal supplied to the tester channel is a function of the combination of logic states of the signals produced at the N IC pads. The tester channel measures the voltage of its input signal so that the logic state of the signals produced at each of the N IC output pads can be determined from the measured voltage.

21 Claims, 6 Drawing Sheets

Figure 4:
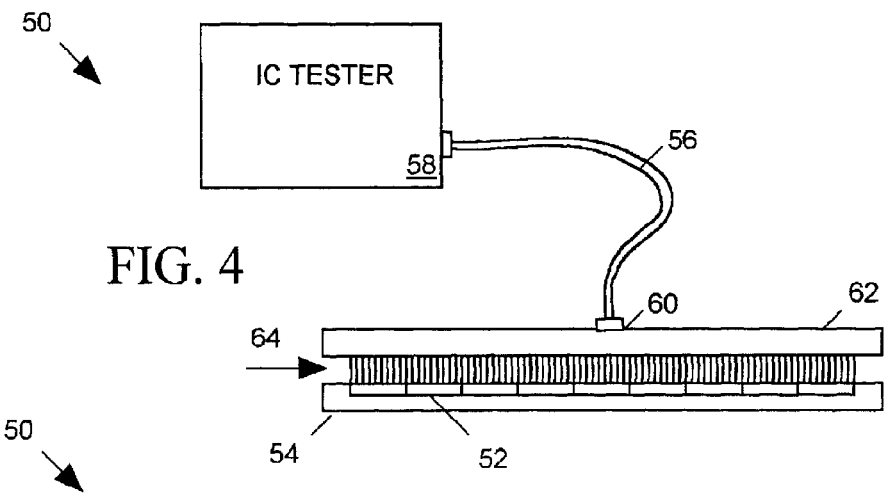

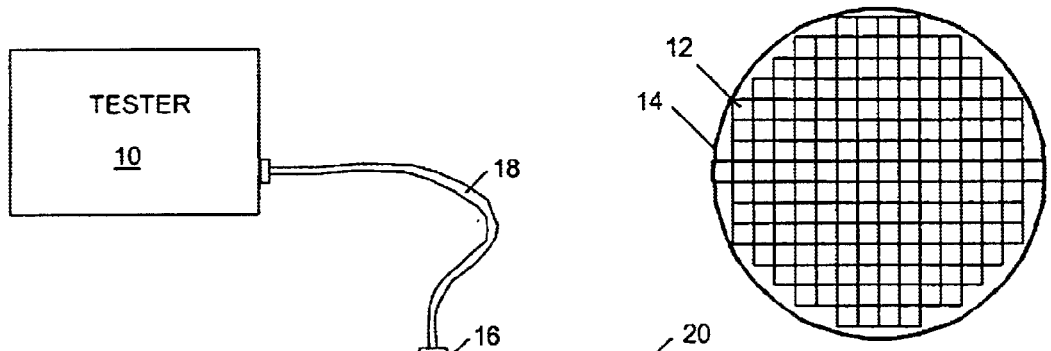
FIG. 1 (PRIOR ART)
FIG. 2 (PRIOR ART)
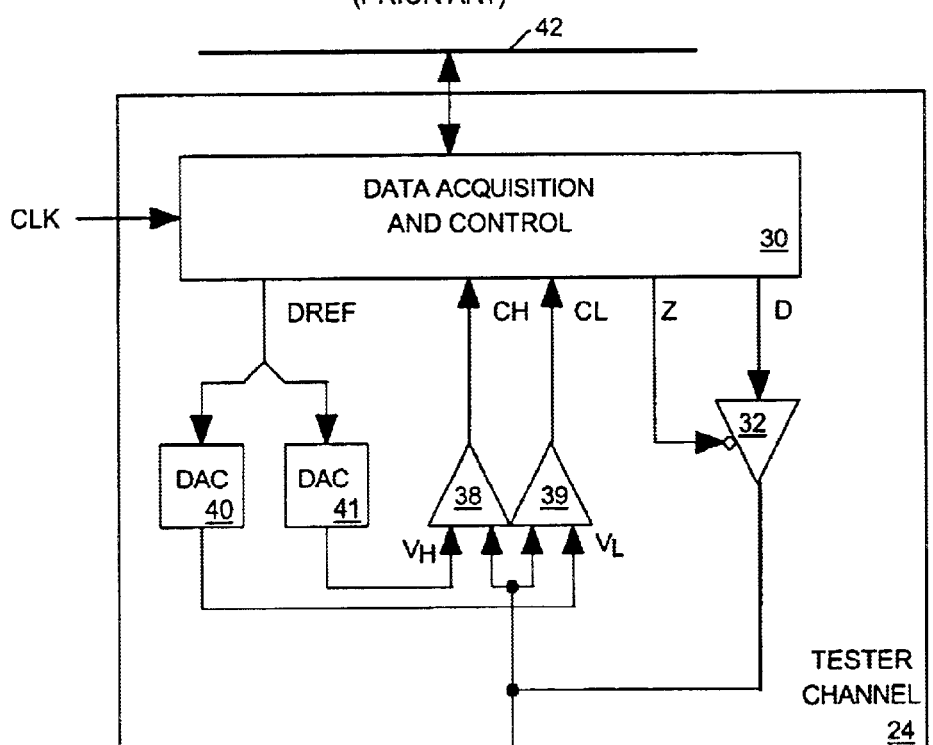
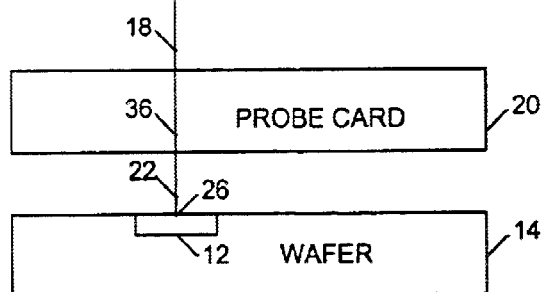
FIG. 3 (PRIOR ART)

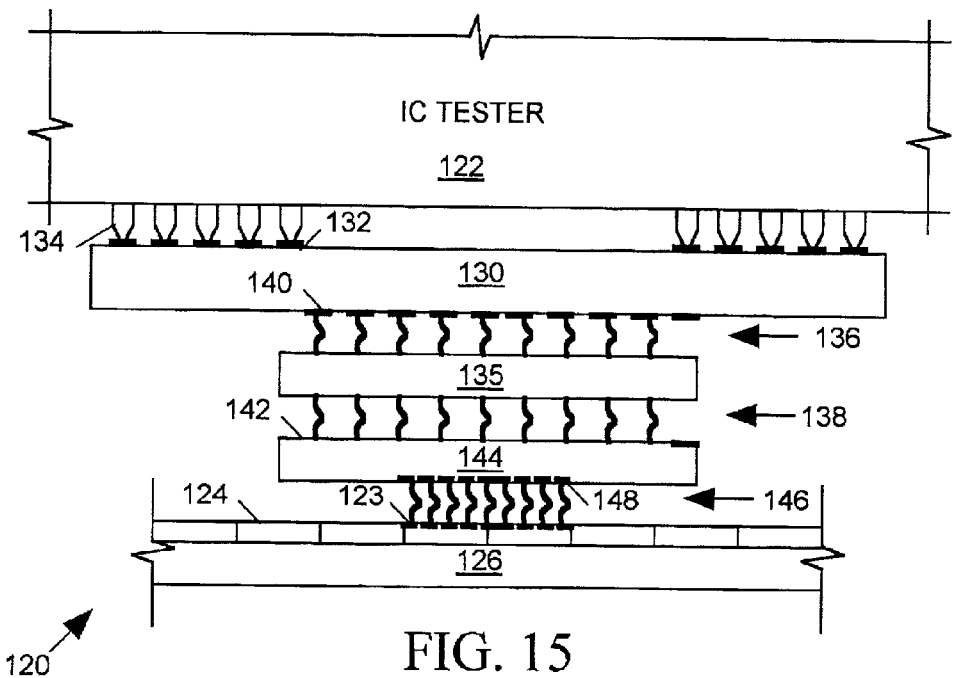
FIG. 15
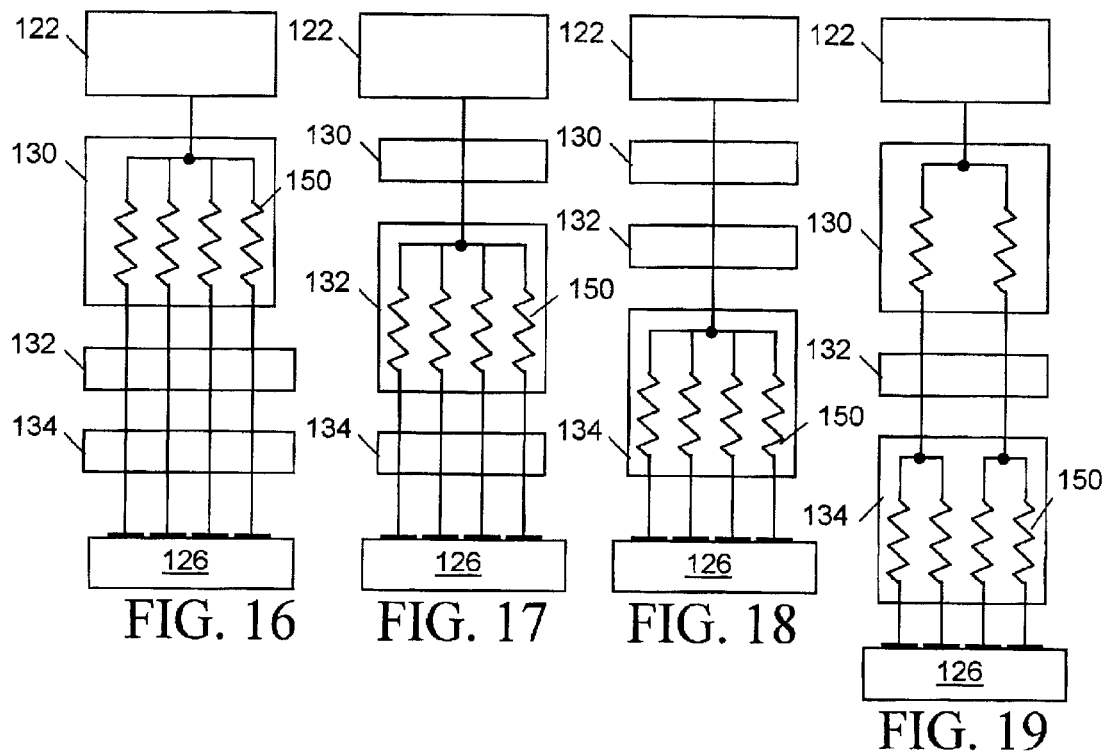
FIG. 16     FIG. 17     FIG. 18
FIG. 19

TESTER CHANNEL TO MULTIPLE IC TERMINALS

FIELD OF THE INVENTION

The invention relates in general to systems for testing integrated circuits (ICs), and in particular to a system for distributing a single test signal output of an IC tester to multiple input terminals of one or more ICs and for determining states of output signals produced at multiple IC output terminals.

DESCRIPTION OF RELATED ART

As illustrated in FIG. 1, an integrated circuit (IC) manufacturer fabricates an array of ICs 12 on a semiconductor wafer 14 and then cuts the wafer to separate the ICs from one another. The manufacturer may then install the ICs in separate packages using bond wires to link the IC's input/output (I/O) terminals (conductive pads on the surface of each IC) to package pins providing signal paths to external circuits. Some ICs include "redistribution" layers covering its I/O terminals. Conductors within the redistribution layers link the IC's I/O terminals to contact pads formed on the top surface of the redistribution layers. The contact pads are larger than the IC's I/O terminals and are more evenly distributed so that the IC can be mounted directly on printed circuit boards (PCBs), for example by soldering the pads to correspondingly arranged contact pads on the surfaces of the PCBs. Spring contacts can also be used to link the IC's redistributed contact pads to a PCB's contact pads. The spring contacts may be formed either on the IC's contact pads or on the PCB's contact pads.

ICs may be tested at the wafer level before they are separated from one another or may be tested after they have separated. Referring to FIG. 2, an IC tester 10 for testing an array of ICs 12 residing on a wafer 14 (or for testing an array of singulated ICs held on a tray) typically includes a set of tester channels, each of which may either transmit a test signal to an IC input pad or monitor an IC output signal produced at an IC output pad to determine whether the IC responds correctly to its input signals. A set of coaxial cables 18 provides signal paths between the tester channels and a cable connector 16 on a probe board 20. A set of probes 22 link pads on the lower surface of probe board 20 to the redistribution or I/O terminal pads on the upper surfaces of ICs 12. Various types of structures can be used to implement probes 22 including, for example, wire bond and lithographic spring contacts, needle probes, and cobra probes. When spring contacts are used to implement probes 22 they may be formed either on pads on the upper surfaces of ICs 12 or on pads on the lower surface of probe board 20.

U.S. Pat. No. 6,064,213, issued May 16, 2000 to Khandros et al., incorporated herein by reference, discloses an example of a card assembly designed to contact spring contacts formed on an IC. U.S. patent application Ser. No. 09/810,871 filed Mar. 16, 2001 (incorporated herein by reference) describes another example of a card assembly employing spring contact probes. U.S. Pat. No. 5,974,662 issued Nov. 2, 1999, issued to Eldridge et al., incorporated herein by reference, descries an example of a probe card assembly in which spring contacts formed on a probe card function as probes. The following documents (incorporated herein by reference) disclose various exemplary methods for manufacturing spring contacts: U.S. Pat. No. 6,333,269 issued Jan. 8, 2002 to Eldridge et al., U.S. Pat. No. 6,255,126 issued Jul. 31, 2001 to Mathieu et al., U.S. patent application Ser. No. 09/710,539 filed Nov. 9, 2000, and U.S. patent application Ser. No. 09/746,716 filed Dec. 22, 2000.

Probe board 20 is typically a multiple layer printed circuit board (PCB) providing signal paths between cable connector 16 and the pads on its lower surface. Traces formed on the various layers of probe board 20 convey signals horizontally while vias convey signals vertically though the layers.

Tester 10 typically provides a separate channel for each pad 26 that is linked to an I/O terminal of an IC to be tested. FIG. 3 illustrates one channel 24 of a typical tester accessing a pad 26 of a wafer 14 via a path 36 through a probe card 20. A test is usually organized into a succession of test cycles of uniform duration, and during each test cycle channel 24 may either provide an input to a pad 26 of an IC 12 formed on wafer 14 or may monitor an IC output signal produced by the IC at pad 26 to determine its state. A data acquisition and control circuit 30, programmed via instructions supplied through a bus 42, controls the action channel 24 is to carry out during each test cycle. When pad 26 is to receive an input signal, circuit 30 sets a tristate control input Z of a tristate driver 32 so that the driver supplies a test signal as input to pad 26. Circuit 30 sets an input signal D to driver 32 during each test cycle so that the test signal is of the correct logic state. The test signal travels to pad 26 through a signal path formed by one of cables 18, the signal path 36 provided by probe card 20, and one of probes 22.

When an IC 12 produces an output signal at pad 26, the output signal passes through probe 22, signal path 36 and cable 18 to become an input signal to a pair of comparators 38 and 39 within channel 24. Comparator 38 asserts a compare high (CH) signal when the voltage of IC output signal is higher than a high logic level threshold voltage produced by a digital-to-analog converter (DAC) 40. Comparator 39 asserts a compare low (CL) signal when the IC output signal voltage is lower than a low logic level threshold voltage produced by another digital-to-analog converter (DAC) 41. Circuit 30 supplies control data DREF as input to DACs 40 and 41 for controlling the voltage levels of the VH and VL reference signals.

For example, when the test signal has 5 volt and 0 volt high and low logic levels, the VH and VL threshold levels might be set to 4.5 and 0.5 volts, respectively, so that an IC output signal over 4.5 volts is treated as a high logic level, an IC output signal under 0.5 volts is treated as a low logic level, and an IC output signal between 0.5 and 4.5 volts is considered neither high nor low logic level. Thus comparators 38 and 39 and DACs 40 and 41 can be thought of as an analog-to-digital converter (ADC) producing a 2-bit thermometer code output {CH, CL} indicating one of three ranges in which the input signal voltage lies.

Data acquisition circuit 30 samples the CH and CL bits at a time during each test cycle when the IC output signal is expected to be at a particular logic level. If the IC output signal is expected to be at its high logic level, then the CH bit should be true and the CL bit should be false when sampled. If the IC output signal is expected to be at is low logic level then CL should be true and CH should be false when sampled. An IC under test is considered to be defective when the sampled CH and CL bits representing the state of any of the IC's output signals are not of their expected states during any test cycle.

In some testers data acquisition and control circuit 30 stores the CH and CL bit for each test cycle in an acquisition memory so that a host computer can access the data via bus 42 at the end of the test and determine whether the IC is defective. In other testers circuit 30 may compare the sampled CH and CL data produced during each test cycle to their expected values and store cycle numbers in an internal memory referencing the particular test cycles, if any, for which the sampled data fails to match their expected values. The host computer then accesses the stored cycle numbers via bus 42.

While tester channels 24 in some testers include two comparators as illustrated in FIG. 3, tester channels in other testers may include only a single comparator. For example when the low and high logic levels of an IC output signal are 0 and 5 volts, respectively, the comparator may be set to drive its single-bit output signal true when the IC output signal exceeds 2.5 volts. Also in many testers channel do not include their own DACs; centralized DACs provide reference voltages in common to all channels.

One drawback to the test system illustrated in FIGS. 2 and 3 is that it requires one tester channel 24 for every pad 26 on wafer 14. Since a wafer 14 can have a large number of ICs 12, and since each IC may have a large number of such pads 26, tester 10 would require a very large number of channels in order to concurrently access all pads 26 of all ICs 12.

What is needed is a system permitting a tester having a limited number of tester channels to concurrently test ICs having a larger number of input and output pads.

BRIEF SUMMARY OF THE INVENTION

Integrated circuits (ICs) formed on a semiconductor typically include conductive pads on their surfaces for receiving IC input signals and for transmitting IC output signals. The invention relates in general to a system for testing ICs before the wafer is cut to separate them, and in particular to an interconnect system for linking a single IC tester channel to multiple (N) IC input or output pads in a way that allows the tester channel to either concurrently transmit a test signal to all N IC input pads or to concurrently monitor and determine states of output signals produced at all N IC output pads.

An interconnect system in accordance with an exemplary embodiment of the invention may include a probe card providing signal paths between the various channels of an IC tester and probes accessing the input and output pads on the surface of the ICs. When a single tester channel is to be connected to each of N IC pads, the probe card provides a branching signal path for distributing the test signal produced by the tester channel to probes accessing each of the N IC pads. Each branch of the path includes a resistor for isolating the IC input pad accessed via that branch from all other branches of the path so that a fault on the IC input pad accessed via that branch does not substantially affect the voltage of the test signal passing through any other branch.

When a single tester channel is to transmit a test signal to all N IC pads, but is not to monitor IC output signals produced at any N IC pads, the resistance of the resistors included in all path branches may be of similar size. However when a single tester channel is to monitor IC output signals produced at all N IC pads, each branch includes a uniquely sized scaling resistor so that each of the $2^N$ combinations of logic states of the signals produced at the N IC output pads results in a different tester channel input signal voltage. In such case, the tester channel measures the voltage of its input signal and the logic state of each of the signals produced at each of the N IC output pads is determined from the measured voltage of the input signal.

The claims appended to this specification particularly point out and distinctly claim the subject matter of the invention. However those skilled in the art will best understand both the organization and method of operation of what the applicant considers to be the best modes of practicing the invention, together with further advantages and objects of the invention, by reading the remaining portions of the specification in view of the accompanying drawings wherein like reference characters refer to like elements.

BRIEF DESCRIPTION OF THE DRAWING(S)

Figure 5:
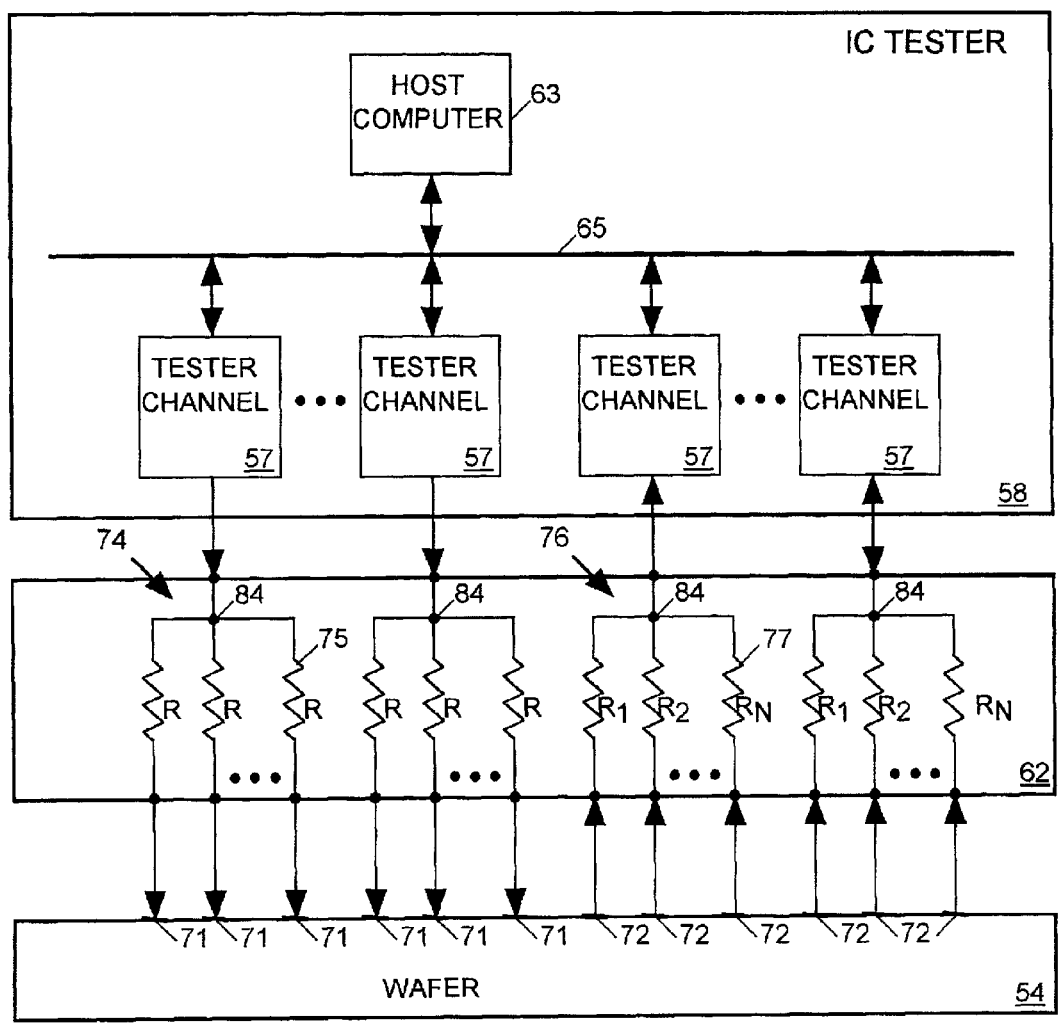
Figure 6:
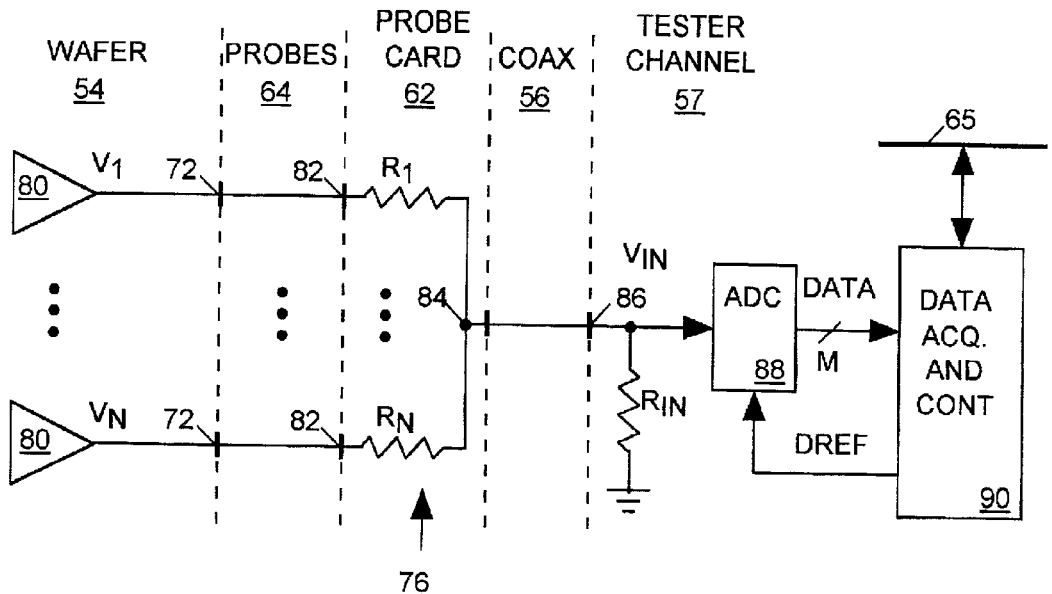

FIG. 1 is a plan view of a prior art semiconductor wafer upon which integrated circuits (ICs) are formed, FIG. 2 is a simplified side elevation view of a prior art wafer level IC test system, FIG. 3 is a block diagram illustrating a portion of the prior art wafer level IC test system of FIG. 3, FIG. 4 is a simplified side elevation view of a wafer level IC test system in accordance with an exemplary embodiment of the invention, FIG. 5 is a block diagram of the wafer level IC test system of FIG. 4, FIG. 6 is a schematic and block diagram of a portion of the wafer level test system of FIG. 5, FIGS. 7–11 are schematic diagrams illustrating a portion of the wafer level test system of FIG. 5, FIGS. 12–14 illustrate alternative embodiments of the analog-to-digital converter of FIG. 6, FIG. 15 is a side elevation view of a probe assembly in accordance with an exemplary embodiment of the invention for providing signal paths between an integrated circuit tester to and a wafer, and FIGS. 16–19 are schematic diagrams illustrating alternative versions of the signal paths provided by the probe assembly of FIG. 15.

DETAILED DESCRIPTION OF EXEMPLARY EMBODIMENTS OF THE INVENTION

This specification describes one or more exemplary embodiments and/or applications of an invention considered by the applicant(s) to be the best modes of practicing the invention. However those of skill in the art will appreciate that there are other modes of practicing the invention, and there is no intention that the invention be limited to the particular embodiment(s) described below or to the manner in which the embodiments operate. The scope of the invention is defined by the claims appended to this specification.

The present invention relates to an apparatus for providing signal paths between an IC tester and terminals of ICs through which the ICs transmit and receive signals so that the tester can test the ICs. Some testers can test many ICs concurrently while they are still in the form of unseparated die on a semiconductor wafer. ICs typically include conductive pads on their surfaces that can act as terminals for receiving IC input signals from external circuits and for transmitting IC output signals to external circuits. While an interconnect system in accordance with an exemplary embodiment of the invention described herein below connects an IC tester to pads of ICs while still in the form of die on a semiconductor wafer, it should be understood that the invention could be employed to connect IC testers to pads of separated unpackaged ICs or to pins or other types of terminals of packaged ICs may also be adapted to employ the invention as described herein below.

FIGS. 4 and 5 illustrate an exemplary system 50 for testing a set of ICs 52 formed on a semiconductor wafer 54. A set of coaxial cables 56 couple each channel 57 of an IC tester 58 to a connector 60 on the upper surface of a probe card 62. Probe card 62 provides signal paths linking the ends of conductors 56 at connector 60 to a set of probes 64. Any type of probe card may be employed. Non-exclusive examples include a single printed circuit board (PCB) with probes attached directly to the PCB (as employed in exemplary system 50) and probe card assemblies including several separate substrate layers interconnected by spring contacts or other means. Other non-exclusive examples of probe cards are disclosed in U.S. Pat. No. 5,974,662 issued Nov., 2, 1999 to Eldridge et al., and U.S. Pat. No. 6,064,213 issued May 16, 2000 to Khandros et al., each of which is incorporated herein by reference.

Various types of structures can be used to implement probes 64 including, for example, wire bond and lithographic spring contacts, needle probes, and cobra probes. When spring contacts are employed to implement probes 64, they can be attached to pads formed on a lower side of probe card 62 and arranged so that their downward extending tips contact a set of pads 71 and 72 formed on the surfaces of ICs 52. Spring contact probes 64 may alternatively be formed on pads 71 and 72 with tips of probes 64 extending upward to contact the pads formed on the lower surface of probe card 62. Pads 71 and 72 may be the ICs' input/output (I/O) terminals or may be redistribution pads that are linked to the ICs' I/O terminals.

U.S. Pat. No. 6,064,213, issued May 16, 2000 to Khandros et al. (incorporated herein by reference) discloses an example of a card assembly designed to contact spring contacts formed on an IC. U.S. patent application Ser. No. 09/810,871 filed Mar. 16, 2001 (incorporated herein by reference) describes another example of a card assembly employing spring contact probes. U.S. Pat. No. 5,974,662 issued Nov. 2, 1999, issued to Eldridge et al., incorporated herein by reference, describes an example of a probe card assembly in which spring contacts formed on a probe card function as probes. The following documents (incorporated herein by reference) disclose various exemplary methods for manufacturing spring contacts: U.S. Pat. No. 6,333,269 issued Jan. 8, 2002 to Eldridge et al., U.S. Pat. No. 6,255,126 issued Jul. 31, 2001 to Mathieu et al., U.S. patent application Ser. No. 09/710,539 filed Nov. 9, 2000, and U.S. patent application Ser. No. 09/746,716 filed Dec. 22, 2000.

Tester 58 typically organizes a test into a succession of test cycles of uniform duration, and during each test cycle each tester channel 57 may generate an output test signal to be supplied to one or more of IC pads 71 and 72 or may receive an input signal having a voltage representing a logic state of IC output signals generated at pads 71 and 72. Before starting a test, a host computer 63 supplies programming instructions to channels 57 via a bus 65 telling each channel 57 what to do during each test cycle.

Some of the pads 71 on the surface of a wafer 54 may act as IC input terminals that can only receive IC input signals generated by channels 57. For example, the pads linked to control and address terminals of a RAM or of a read only memory (ROM) are uni-directional input terminals.

Other pads 72 on wafer 54 may act as uni-directional IC output terminals that can only produce IC output signals at the pads or as bi-directional input/output terminals that can both transmit and receive signals. For example, pads linked to data terminals of a ROM are uni-directional output pads whereas the pads linked to data terminals of a RAM are bi-directional I/O pads.

If tester 58 were to include a separate tester channel 57 for each pad 71 or 72, probe card 62 could provide a separate signal path 68 between each pad 71 or 72 and its corresponding tester channel 57. For example ICs 52 might be RAMs for storing 8-bit data at 8-bit addresses. The RAMs could be tested by writing data to each address and then reading the data back out to determine whether it matches the data written into that address. Each RAM would have eight input pads 71 for receiving an address, eight I/O pads 72 for transmitting and receiving data, and, for example, two input pads 71 for receiving control signals. If probe card 62 were to connect only one pad to each channel 57, IC tester 58 would have to provide 18 channels 57 for each RAM to be tested. If wafer 54 contained 100 RAMS, then tester 58 would have to have 1800 channels in order to test all RAMs concurrently.

Since all ICs 52 formed on wafer 54 are usually similar and are tested in the same way and at the same time, each IC 52 would receive the same set of input address and control signals during any given test cycle. To reduce the number of tester channels 57 needed, probe card 62 provides a set of branching signal paths 74, each for linking one tester channel 57 to more than one IC input pad 71. For example, when the ICs 52 being tested are RAMs having 8-bit input addresses A0–A7, probe card 62 delivers an output signal of one tester channel 57 as the A0 address input to each of multiple (N) RAMs, seven other tester channels 57 supply the A1–A7 address bits to the same set of N RAMs. Thus only eight channels 57, rather than 8*N channels, are needed to supply an 8-bit address to each of N RAMs. Similarly branched paths 74 may be provided to deliver a control signal produced by one channel 57 to inputs pads of N RAMs.

Various faults can occur at any input pad 71. For example a pad 71 may be shorted through a low impedance path to ground, to a power source, or to a nearby signal pad 71 or 72. Each branch of a signal path 74 delivering an input signal to more than one IC input pad 71 includes an isolation resistor 75. All resistors 75 in paths 74 linked to uni-directional input pads 71 may be of similar or differing resistance, however all isolation resistors 75 are of sufficient size that a fault at any one IC input pad 71 will not substantially influence the voltage of the channel output signal VOUT supplied to any other IC input pad 71 through the same path 74.

Probe card 62 also provides another set of branching signal paths 76, each linking a set of N IC output or I/O pads 72 to the same circuit node 84 within the probe card. When pads 72 are to receive input signals, a single tester channel 57 supplies the same input signal to all N pads 72 via the branching path 76. When pads 72 are to produce output signals, a signal developed at node 84 of path 76 in response to the N IC output signals produced at pads 72 is supplied as an input signal to a single tester channel 57.

Each $i^{th}$ branch of an N-branch signal path 76 includes a scaling resistor 77 of magnitude $R_i$. The scaling resistors 77 in the branches of any signal path 76 are all of differing resistances so that the voltage of the signal developed at node 84 depends on the combination of logic states of all of the IC output signals produced at the N output pads 72 linked to node 84. Assuming the N IC output signals form an N-bit binary number, then with values of resistors 77 appropriately chosen, the voltage of the signal developed at node 84 will be a monotonic function of the value of that binary number. When a tester channel 57 measures the voltage of the signal developed at one of nodes 84 with sufficient resolution, it is possible to determine the logic state of each of the N signal produced at the IC output pads 72 that are linked to that node.

FIG. 6 shows a set of N drivers 80 within ICs formed on wafer 54 generating a set of N output signals $V_1$–$V_N$ produced at IC output pads 72. Probes 64 deliver output signals $V_1-V_N$ to a set of pads 82 on the lower surface of probe card 62. Probe card 62 provides a branching path 76 including scaling resistors $R_1-R_N$ for linking pads 82 to a common node 84. A coaxial cable 56 links node 84 to an input terminal 86 of a tester channel 57. When coaxial cable 56 has a characteristic impedance of, for example 50 Ohms, an optional 50 Ohm resistor RIN may be provided within tester channel 57 to terminate the coaxial cable when necessary to eliminate signal reflections at terminal 86. Termination resistor RIN may not be needed in applications where such signal reflections are not problematic.

Tester channel 57 includes an analog-to-digital converter (ADC) 88 for receiving the VIN signal and for producing M-bit thermometer code output data (DATA). Each of the M+1 possible values of DATA represents a different voltage range. The current value of DATA indicates the particular range within which the voltage of the ADC's VIN input signal resides. Each tester channel 57 also includes a data acquisition and control circuit 90 supplying reference data DREF as input to ADC 88 for controlling the relationship between each value of DATA and the voltage range it represents.

Circuit 90 also samples the value of the DATA output of ADC 88 at a time during each test cycle at which the $V_1-V_N$ signals are expected to stabilize at their expected logic levels. Before starting a test, host computer 63 of FIG. 5 programs circuit 90 with instructions supplied via bus 66 telling it how to adjust the range of ADC 88 and indicating times during each test cycle at which the DATA value is to be sampled. In one embodiment of the invention, circuit 90 stores the sampled value of DATA for each test cycle so that host computer 63 (FIG. 5) can thereafter read the sampled DATA value to determine the voltage of the VIN signal produced during each cycle of the test. This enables the host computer to determine the logic state of each IC output signal $V_1-V_N$ during each test cycle. Alternatively, the instructions that the host computer supplies to control circuit 90 before the start of the test may indicate expected values of the DATA output of ADC 88 for each test cycle. Circuit 90 then determines from DATA value acquired during each test cycle whether any output signal $V_1-V_N$ is of an incorrect state during any test cycle.

Figure 7:
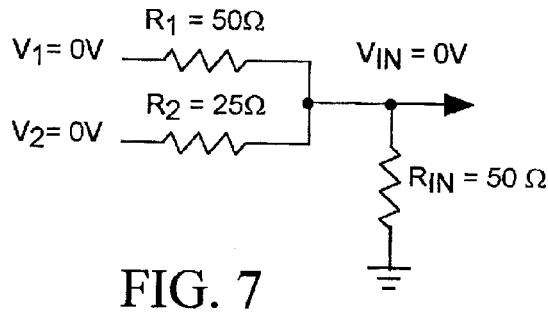
Figure 8:
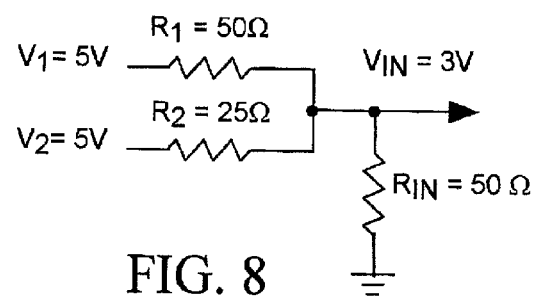
Figure 9:
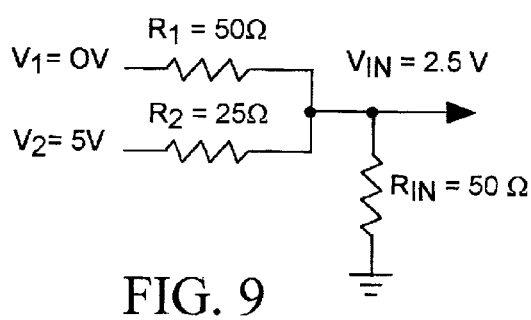
Figure 10:
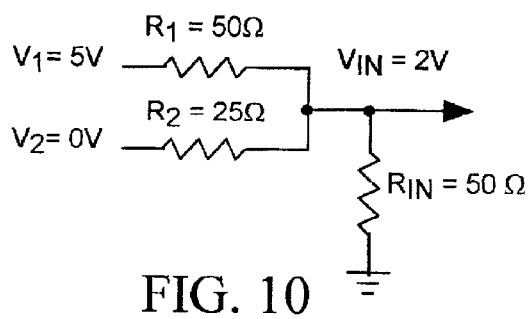

Assume, for example, that N=2, so that probe card 62 links two IC output pads 72 to the input 86 of one tester channel 57. Assume also that the nominal low and high logic levels for each output signal $V_1-V_N$ are 0 and 5 volts, the output impedance of each driver 80 is much lower than 50 Ohms, and the input impedance of ADC 88 is much higher than 50 Ohms. Further, assume as depicted in FIGS. 7–10 that RIN=50 Ohms, $R_1$=50 Ohms, and $R_2$=25 Ohms. Then as illustrated in FIG. 7, when both $V_1$ and $V_2$ are 0 volts, VIN will be 0 volts. As illustrated in FIG. 8, when both $V_1$ and $V_2$ are 5 volts, VIN will be 3 volts. FIG. 9 shows that when $V_1$ is 0 volts and $V_2$ is 5 volts, VIN will be 2.5 volts. As seen in FIG. 10, when $V_1$ is 5 volts and $V_2$ is 0 volts, VIN will be 2 volts. Table I summarizes the relationships between voltage magnitudes of $V_1$, $V_2$ and VIN.

TABLE I

| $V_2$ | $V_1$ | VIN |
|---|---|---|
| 0 | 0 | 0 |
| 0 | 5 | 2 |
| 5 | 0 | 2.5 |

TABLE I-continued

| $V_2$ | $V_1$ | VIN |
|---|---|---|
| 5 | 5 | 3 |

Since VIN may be of any of four different voltage levels depending on the logic states of the $V_1$ and $V_2$ signals, it is possible to determine the logic state of each signal when ADC 88 is able measure the voltage of VIN with sufficient resolution. When M=3, ADC 88 produces a 3-bit output thermometer code DATA which can represent any of four voltage ranges. In such case circuit 90 may, for example, set the DREF data input to ADC 88 so that ADC 88 responds to values of VIN in the ranges indicated in TABLE II by producing the indicated values of the 3-bit thermometer code DATA.

TABLE II

| VIN | DATA |
|---|---|
| VIN < 1.75 | 000 |
| 1.75 V < VIN < 2.25 V | 001 |
| 2.25 V < VIN < 2.75 V | 011 |
| 2.75 V < VIN | 111 |

With these ADC settings, the data input to data acquisition and control circuit 90 distinguishes from among the four possible voltage levels of the VIN signal and therefore enables circuit 90 or the host computer to determine the logic state each of the IC output signals $V_1$ and $V_2$ from which the VIN signal is derived.

Figure 11:
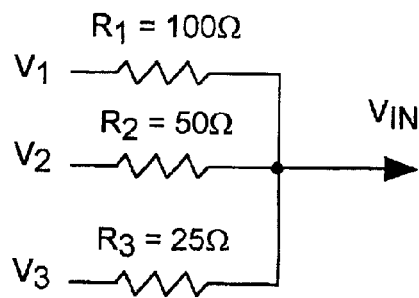

FIG. 11 illustrates an example in which N=3 such that probe card 62 of FIG. 6 links the output pads 72 of three ICs 52 to the input terminal of a single tester channel 57. Assume again that the low and high logic levels of the IC output signals $V_1-V_3$ produced at the three IC output pads 72 are 0 and 5 volts and that the input impedance of ADC 88 is very high, and the output impedance of drivers 80 is very low. In this example we assume signal reflections at terminal 86 of channel 57 are not problematic and that no resistor RIN is needed to terminate coaxial cable 56 with its characteristic impedance.

As illustrated in FIG. 11 we can, for example, set $R_1$=100 Ohm, $R_2$=50 Ohms and $R_3$=25 Ohms. Table III below illustrates the possible combinations of $V_1-V_3$ voltages and the VIN voltage resulting from each combination:

TABLE III

| $V_3$ | $V_2$ | $V_1$ | VIN |
|---|---|---|---|
| 0 | 0 | 0 | 0 |
| 0 | 0 | 5 | 0.71 |
| 0 | 5 | 0 | 1.43 |
| 0 | 5 | 5 | 2.14 |
| 5 | 0 | 0 | 2.86 |
| 5 | 0 | 5 | 3.57 |
| 5 | 5 | 0 | 4.29 |
| 5 | 5 | 5 | 5 |

When ADC 88 is capable of producing a 7-bit output thermometer code DATA, circuit 90 may, for example, set ADC 88 to respond to values of VIN in the ranges indicated in TABLE IV below by producing the indicated values of thermometer code DATA.

TABLE IV

| VIN | DATA |
|---|---|
| VIN < .35 V | 0000000 |
| .35 v < VIN < 1.05 V | 0000001 |
| 1.05 V < VIN < 1.75 V | 0000011 |
| 1.75 V < VIN < 2.50 V | 0000111 |
| 2.50 V < VIN < 3.20 V | 0001111 |
| 3.20 V < VIN < 3.90 V | 0011111 |
| 3.90 V < VIN < 4.65 V | 0111111 |
| 4.65 V < VIN | 1111111 |

In general, when probe card 62 employs a set of N scaling resistors $R_1$–$R_N$ of appropriately dissimilar resistances to combine the output signals $V_1$–$V_N$ of a set of N IC output pads 72 to form a single signal input VIN to ADC 88, the various combinations of $V_1$–$V_N$ logic states may drive the VIN signal to any of $2^N$ voltage levels. In order to enable data acquisition and control circuit 90 or a host computer to distinguish from among the $2^N$ VIN possible voltage levels, and therefore to determine the logic state of each signal $V_1$–$V_N$, the DATA output of ADC 88 is preferably at least $M=2^N-1$ bits wide, and the voltage ranges represented by each value of DATA must be appropriately selected.

However as illustrated in FIG. 3, a channel 24 of a prior art IC tester to be employed in this application may have, for example, only two comparators 38 and 39. Such a tester channel 24 can compare a VIN signal to only two reference levels VH and VL produced by a pair of digital-to-analog converts (DACs) 40 and 41. Thus comparators 38 and 39 and DACs 40 and 41 can act as an ADC capable of producing only a 2-bit thermometer code {CH, CL} representing the voltage level of the VIN signal as residing within one of only three ranges. Tester channels in some prior art IC testers include only a single comparator acting as a single-bit ADC that can distinguish between only two voltage ranges.

When a probe card in accordance with an exemplary embodiment of the invention combines multiple (N) IC output signals in the manner described above to produce a VIN signal input to a tester channel having only one or two comparators, the channel's 1 or 2 bit comparator output does not represent the voltage of the VIN signal with sufficient resolution to enable a host computer to determine the state of each of the N IC output signal $V_1$–$V_N$. Nonetheless, it is possible to use a conventional tester channel producing only a 1-bit or 2-bit thermometer code output (i.e. M<3) to monitor a VIN signal representing multiple IC output signals $V_1$–$V_N$, and yet provide sufficient information to enable the host computer to determine the state of all signals $V_1$–$V_N$ during each test cycle.

One way to do that is perform the same test on the ICs several times, with the comparator reference voltages being set to different values during each repetition of the test. For example, assume that three IC output signals $V_1$–$V_3$ having low and high states of 0 volt and 5 volts are combined as illustrated in FIG. 11 to provide a single VIN input to a tester channel having only a single comparator. Thus, referring to FIG. 6, N is 3 and M is 1. VIN could be of any of 8 levels as illustrated in Table III above. Since the ADC output DATA has only a single bit and can only represent two VIN voltage ranges and not eight, data acquisition and control circuit 90 is programmed to run the test seven times. For example, referring to Table IV above, during all cycles of the first repetition of the test, ADC 88 is set to drive the single-bit DATA to a 1 when VIN exceeds 0.35 volts. During all cycles of the second repetition of the test, ADC is set to drive DATA to a 1 only when VIN exceeds 1.05 volts. During the third through the seventh repetitions of the test, ADC is set to drive DATA to a 1 when VIN exceeds 1.05V, 1.75V, 2.50V, 3.20 v, 3.90V, and 4.65V, respectively. The seven bits of data acquired during the Kth cycle of each of the seven repetitions of the test will enable the host computer 63 to determine the state of each signal $V_1$–$V_3$ during that Kth test cycle.

When data acquisition and control circuit 90 is capable of adjusting the DREF input to ADC 88 at the start of each test cycle (rather than only at the start of each test), test cycles in which the IC's output signals states are to be determined can be repeated 7 times using a different value of DREF for each repetition. For example when a single tester channel is monitoring data bit outputs $V_1$–$V_3$ of a ROM IC, the ROM's address inputs are kept the same for seven test cycles so that each ROM continues to read out data at the same address for seven test cycles. However DREF is set to a different value for each of the seven cycles so that the state of each bit $V_1$–$V_3$ can be determined from the sequence of seven DATA bits produced during those seven test cycle.

Increasing the number M of bits in the DATA output of ADC 88 decreases the number of times each data read cycle must be repeated in order to gather a sufficient amount of data to determine the voltage level of each of the combined IC output signals. For example a tester channel having two comparators acting as an ADC 88 producing a 2-bit (M=2) output DATA could be used to monitor a VIN signal representing the combination of three IC output signals $V_1$–$V_3$ if each test cycle were repeated four times, with the DREF data being appropriately adjusted prior to each test repetition.

Figure 12:
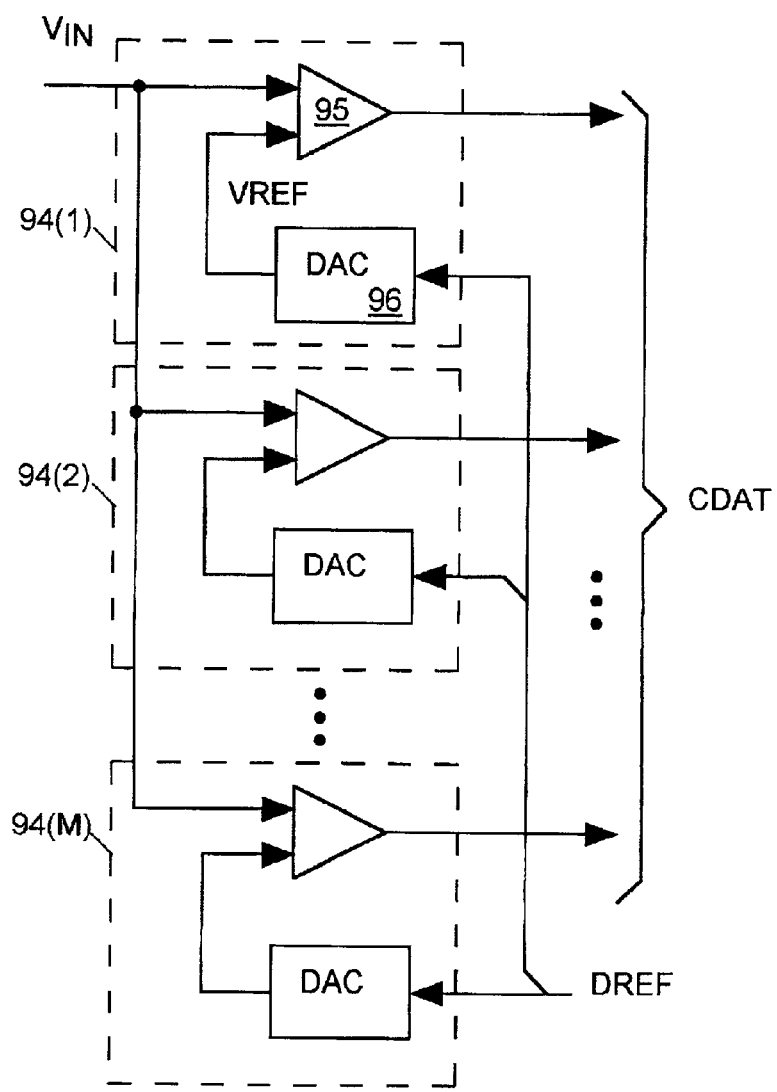

The M-bit ADC 88 of FIG. 6 may have any of a variety of architectures. FIG. 12 illustrates an exemplary ADC having M comparator units 94(1)–94(M), each including a comparator 95 and a DAC 96. The DAC 96 of each comparator unit 94 converts a separate field of the DREF data into a reference voltage VREF. The comparator 95 of each unit 94 compares the VIN signal to reference voltage VREF to produce a separate bit of M-bit output DATA.

Figure 13:
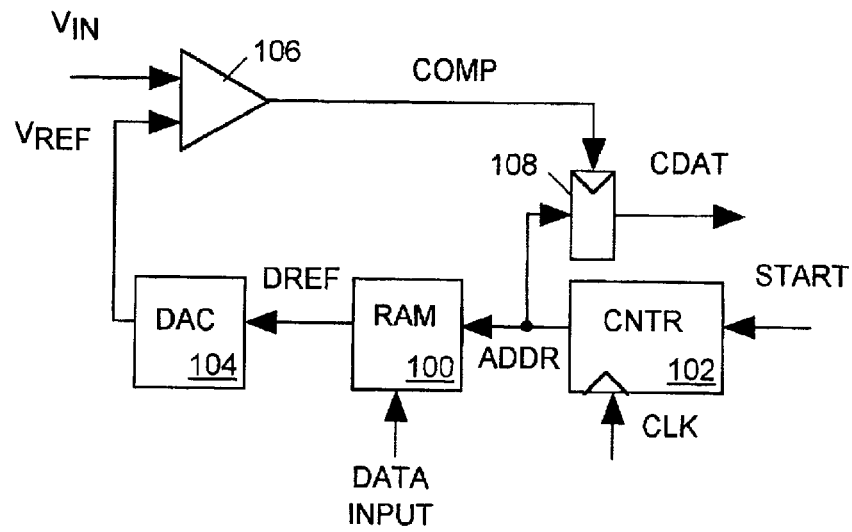

FIG. 13 illustrates another suitable architecture for ADC 88 of FIG. 6. Selected values of the DREF data are written into successive addresses of a RAM 100 addressed by the output ADDR of a counter 102. A DAC 104 converts data read out of RAM 100 into a reference voltage VREF supplied as input to a comparator 106 which compares VREF to VIN and asserts its output COMP when VREF is higher in voltage than VIN. A leading edge of the COMP output of comparator 106 clocks a register 108 which stores the ADDR output of counter 102. Register 108 supplies its contents as the ADC's DATA output. A START signal pulse supplied by circuit 90 of FIG. 6 marks a point during each test cycle at which the VIN data is expected to stabilize to a high or logic level. The START signal resets the counter's ADDR output to 0, and thereafter counter 102 increments its ADDR output on each pulse of a clock signal CLK so that RAM 100 successively reads out DREF data stored at successive RAM addresses. DAC 104 responds to the continuously increasing DREF data by continuously increasing the VREF input to comparator 106. When VREF exceeds VIN, comparator 106 asserts the COMP signal causing register 108 to store the current ADDR output of counter 102. Thus by the time counter 102 has reached its count limit during the test cycle, register 108 will have stored the ADDR value resulting in the lowest VREF voltage that exceeds VIN. In this version of ADC 88, the DATA value can appear in binary-encoded form rather than in thermometer code form. With the DREF data stored in RAM 100 providing a sufficient number of appropriately adjusted VREF levels, a host computer can determine the $V_1$–$V_N$ signal states from the DATA output of register 108.

Figure 14:
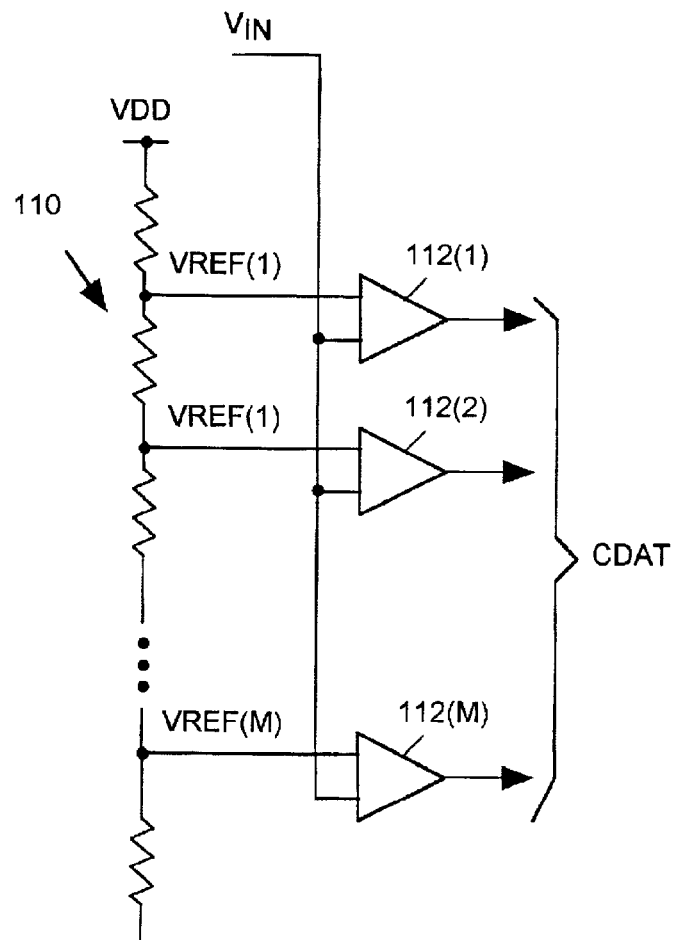

FIG. 14 illustrates a version of ADC 88 of FIG. 6 suitable for use in a tester that is customized to test a particular kind of IC. In such case, the reference voltage levels represented by the various values of DATA need not be adjustable. The ADC of FIG. 14 includes a resistor network 110 dividing a supply voltage VDD to produce a set of reference voltages VREF(1)–VREF(M) supplied as input to a set of M comparators 112(1)–112(M). Each comparator 112 compares its input reference voltage to VIN to produce a separate bit of the ADC's output DATA.

FIG. 15 illustrates another exemplary embodiment of the invention, a multiple-layer probe card assembly 120 for providing signal paths between an integrated circuit tester 122 and pads 123 on surfaces of IC dice 124 on a wafer 126 under test. Probe card assembly 120 includes a probe board 130 having a set of pads 132 on its upper surface for receiving tips of a set of pogo pin connectors 134 providing signal paths between tester 122 and pads 132. An interposer layer 135 having a set of spring contacts 136 and 138 connected to its upper and lower surfaces provides signal paths between a set of contacts 140 on the lower surface of probe board 130 and a set of contacts 142 on an upper surface of a space transformer board 144. A set of probes 146 provide signal paths between pads 148 on the lower surface of space transformer 144 and IC pads 123. Probe board 130, interposer 138 and space transformer 144 may include single or multiple insulating substrates with traces formed on the substrates and vias extending through the substrate for conducting signals horizontally and vertically between pads and/or contacts on their upper and lower surfaces.

In accordance with this exemplary embodiment of the invention, some of the signal paths though probe board assembly 120 branch so that a channel of IC tester 122 employing a single one of pogo pins 134 as an input and/or output terminal can concurrently access more than one IC pad 123. Isolation resistors (not shown in FIG. 15) formed on or within one or more of layers 130, 135 and 144 are included in the branching paths between pogo pins 134 and IC pads 123.

FIGS. 16–19 are schematic diagrams illustrating various alternative versions of a branching signal path within probe board assembly 120. In FIG. 16 the isolation resistors 150 are formed on or between layers of probe board 130. In the versions of FIGS. 17 and 18, the isolation resistors 150 are formed on or between layers of interposer 135 and space transformer 134. A hierarchical resistor network may also be implemented by mounting resistors on one or more boards of probe board assembly 120. For example, FIG. 19 illustrates a signal path including a hierarchy of isolation resistors 150 formed on probe board 130 and on space transformer 134. Resistors 150 may be of suitably differing values as described above when one tester channel is to monitor IC output signals at more than one IC pad 123.

Thus has been shown and described a probe card for providing signal paths between IC tester channels and input and output pads the surfaces of ICs formed on a semiconductor wafer wherein some of the paths link one tester channel to more than one input or output pad. The forgoing specification and the drawings depict the best modes of practicing the invention, and elements or steps of the depicted best modes exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps depicted in the specification and drawings.

What is claimed is:

1. An apparatus for providing signal paths between integrated circuit (IC) tester channels and input and output pads residing on surfaces of a plurality of ICs, wherein the ICs are adapted to receive test signals via the input pads and to generate output signals at the output pads in response to the test signals, and wherein voltages of the test signals and the output signals represent logic states, the apparatus comprising:

a first node; and

N first signal paths, wherein N is an integer greater than one, wherein each first signal path links a separate one of the output pads to the first node, such that a first signal is produced at the first node in response to a set of N output signals generated at the output pads linked to the first node, and wherein all N first signal paths have substantially differing resistances such that a voltage of the first signal has a unique magnitude for each unique combination of logic states of the set of N output signals.

2. The apparatus in accordance with claim 1 further comprising first conductive means for delivering the first signal appearing at the first node as an input signal to one of the IC tester channels.

3. The apparatus in accordance with claim 1 further comprising:

a second circuit node;

a plurality of second signal paths, each corresponding to a separate one of the IC input pads and delivering a test signal from the second circuit node to the corresponding IC input pad, wherein each second signal path is of sufficient resistance that a short linking the corresponding IC input pad to any source of potential within the IC upon which the IC input pad resides would not alter the logic state of the test signal at the second circuit node.

4. The apparatus in accordance with claim 3 further comprising:

first conductive means for delivering the first signal appearing at the first node as an input signal to one of the IC tester channels, and second conductive means for delivering a test signal produced by another of said tester channels to the second circuit node.

5. An apparatus for providing signal paths between integrated circuit (IC) tester channels and input pads and output pads residing on surfaces of a plurality of ICs, wherein the ICs are adapted to receive test signals via the input pads and to generate output signals at the output pads in response to the test signals, and wherein voltages of the test signals and the output signals represent logic states, the apparatus comprising:

at least one substrate having a surface;

a first circuit node formed on said at least one substrate;

N first conductive pads formed on said surface, where N is an integer greater than 1;

N first probes, each first probe linking a separate one of N of said output pads to a corresponding one of the N first conductive pads; and N first signal paths, each linking a corresponding one of the N first conductive pads to said first circuit node such that a first signal is produced at the first circuit node in response to a set of N output signals generated at the output pads linked to the first circuit node, all N first signal paths have substantially differing resistances such that a voltage of the first signal has a unique magnitude for each unique combination of logic states of the set of N output signals.

6. The apparatus in accordance with claim 5 wherein portions of the N first signal paths are formed on said at least one substrate.

7. The apparatus in accordance with claim 5 wherein said at least one substrate comprises:

a first substrate having said surface; and a second substrate, spaced from said first substrate, said first circuit node being formed on said second substrate, wherein said first signal paths are formed on and extend between the first and second substrates.

8. The apparatus in accordance with claim 5 where said at least one substrate comprises:

a first substrate having said surface; and a second substrate, spaced from said first substrate, said first circuit node being formed on said second substrate; and a third substrate residing between and spaced from said first and second substrates, wherein said first signal paths are formed on and extend between the first, second and third substrates.

9. The apparatus in accordance with claim 5 further comprising first conductive means for delivering the first signal appearing at the first circuit node as an input signal to one of the IC tester channels.

10. The apparatus in accordance with claim 5 wherein each first probe comprises a spring contact.

11. The apparatus in accordance with claim 5 wherein the apparatus further comprises:

a second circuit node formed on the substrate;

a plurality of second conductive pads formed on the surface of the substrate;

a plurality of second probes, each second probe linking a separate one said input pads to a corresponding one of the plurality of second conductive pads; and a plurality of second signal paths, each corresponding to a separate one of the second conductive pads for delivering a test signal applied to the second circuit node to the corresponding second conductive contact, wherein each second signal path has substantial resistance sufficient to prevent a fault at any of the inputs pads from affecting a logic state of the test signal applied at the second circuit node.

12. The apparatus in accordance with claim 11 further comprising:

first conductive means for delivering the first signal appearing at the first circuit node as an input signal to one of the IC tester channels, and second conductive means for delivering a test signal produced by another of said tester channels to the second circuit node.

13. The apparatus in accordance with claim 12 wherein each first probe and each second probe comprises a spring contact.

14. An apparatus for testing integrated circuit (ICs), wherein the ICs have input pads at which the ICs receive test signals, and have output pads at which they produce output signals in response to the test signals, the test and output signals having voltages representing logic states, the apparatus comprising:

a first circuit node;

N first signal paths, wherein N is an integer greater than one, wherein each first signal path links a separate one of the output pads to the first circuit node, and wherein each first signal path has a resistance differing substantially from a resistance of any other of the first signal paths, such that a first signal appears at the first circuit node having a first voltage representing a combination of logic states of the output signals produced by the output pads linked by the first signal paths to the first circuit node; and a first IC tester channel linked to the first circuit node including means for measuring the first voltage of the first signal.

15. The apparatus in accordance with claim 14 wherein the means for measuring the first voltage of the first signal comprises an analog-to-digital converter (ADC) for generating output data in response to the first signal, wherein a value of the output data represents a voltage range in which said first voltage resides.

16. The apparatus in accordance with claim 15 wherein the ADC comprises:

a digital-to-analog converter (DAC) for generating a reference voltage of magnitude determined by a value of control data supplied as input to the DAC; and a comparator receiving the reference voltage and the first signal for generating an output bit indicating whether the first voltage is greater than the reference voltage.

17. The apparatus in accordance with claim 16 wherein the ADC further comprises means for periodically altering the value of the control data.

18. The apparatus in accordance with claim 15 wherein the ADC comprises:

means for generating M reference voltages, of substantially differing magnitudes, where M is an integer greater than 1, and M comparators, each comparator corresponding to a separate one of the M reference voltages, each comparator receiving its corresponding reference voltage and the first signal as inputs, and each comparator generating a separate bit of an M-bit data word, wherein the bit generated by each comparator indicates whether the first voltage is greater than its corresponding reference voltage.

19. The apparatus in accordance with claim 18 wherein M is at least as large as $2^N-1$ and wherein the magnitudes of said M reference voltages are such that each possible combination of logic states of the output signals produced by the output pads linked by the first signal paths to the first circuit node results in a unique value of the M-bit data word.

20. A method for testing at least one integrated circuit (IC) device wherein at least one IC device comprises a plurality of terminals at which said at least one IC device receives input signals and concurrently produces output signals, wherein voltages of the input and output signals represent logic states, the method comprising the steps of:

a. providing a first circuit node;

b. providing a plurality of first signal paths, each first signal path linking a separate one of the plurality of terminals to the first circuit node, such that a first signal is produced at the first circuit node in response to IC output signals concurrently generated at each of the plurality of IC terminals, wherein all first signal paths have substantially differing resistances such that a voltage of the first signal produced at the first circuit node has a unique magnitude for each unique combination of logic states of the IC output signals produced at the plurality of IC terminals;

c. measuring a voltage of the first signal produced at the first circuit node; and d. determining a logic state of each of the plurality of output signals from the voltage measured at step c.

21. The method in accordance with claim 20 further comprising the step of:

e. applying a test signal to the first circuit node such that the test signal travels from the first circuit node to each of the plurality of IC terminals via a separate one of the first signal paths, such that the test signal becomes an input signal received by each of the plurality of IC terminals.

* * * * *